United States Patent [19]

Snyder

[11] 4,322,572
[45] Mar. 30, 1982

[54] ELECTROMAGNETIC INTERFERENCE SHIELDING DEVICE

[75] Inventor: Delmer E. Snyder, Hillsboro, Oreg.

[73] Assignee: Tektronix, Inc., Beaverton, Oreg.

[21] Appl. No.: 87,283

[22] Filed: Oct. 22, 1979

[51] Int. Cl.³ .............................................. H05K 9/00
[52] U.S. Cl. .................................... 174/35 R; 52/773;
220/80; 312/257 R; 339/95 R; 428/575;
428/603
[58] Field of Search .......... 174/35 R, 35 GC, 35 MS;
339/95 R; 428/571, 572, 573, 574, 575, 603;
220/80; 52/732, 773, 774; 16/DIG. 6; 312/257
R; 361/429

[56] References Cited

U.S. PATENT DOCUMENTS

| 1,903,469 | 4/1933 | Meader | 24/81 B |
| 2,133,789 | 10/1938 | Pool | 174/35 GC |
| 2,680,902 | 6/1954 | Amico | 428/603 X |
| 4,115,655 | 9/1978 | Prentice | 174/35 R |
| 4,123,129 | 10/1978 | Butler | 312/257 R |

Primary Examiner—B. A. Reynolds
Assistant Examiner—David A. Tone

[57] ABSTRACT

An electromagnetic interference (EMI) shielding device for use in supporting members that receive enclosure covers of electrical or electronic instruments. The EMI device comprises an L-shaped strip of metal having first contact means which maintain the device in position in a groove in the supporting member and provide electrical contact therewith and spring contact means against which an edge of an enclosure member disposed in the groove engages thereby providing electrical contact therewith and securely maintaining the enclosure member in position.

7 Claims, 4 Drawing Figures

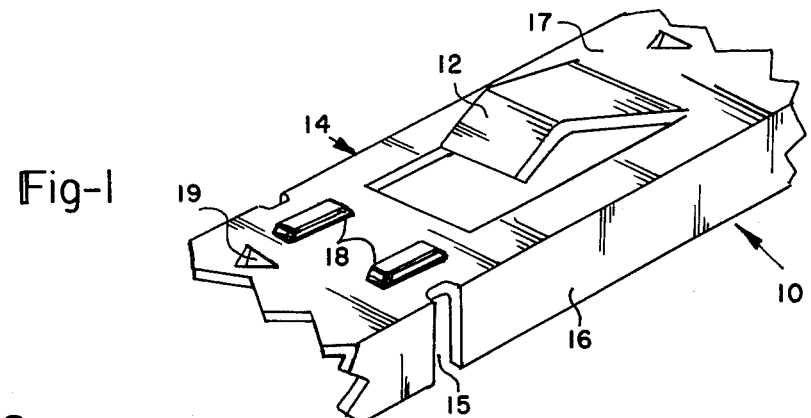
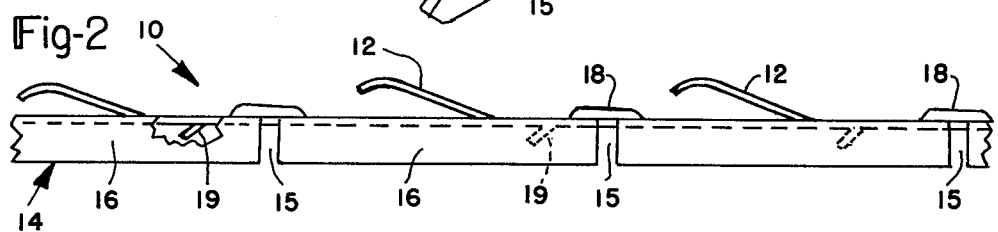
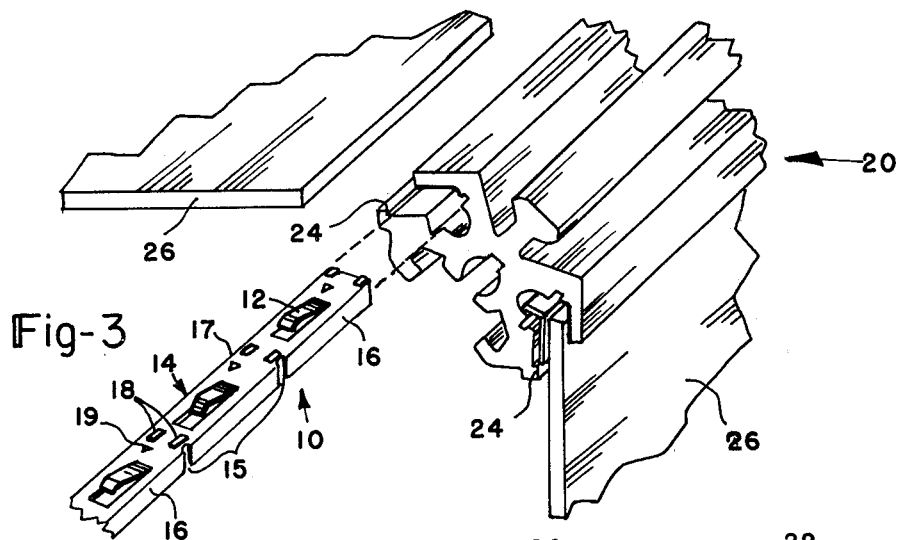
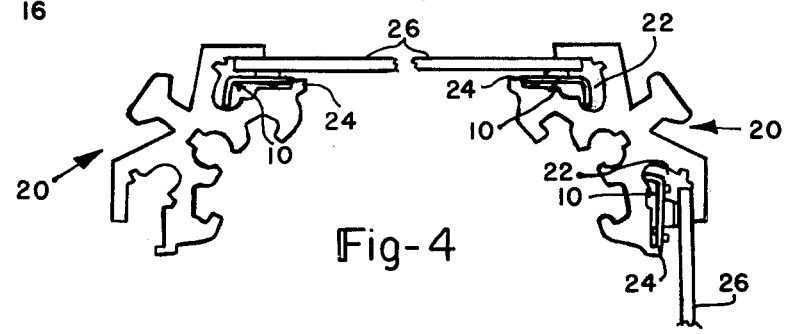

4,322,572

ELECTROMAGNETIC INTERFERENCE SHIELDING DEVICE

BACKGROUND OF THE INVENTION

Electronic and electrical cabinets and enclosures are being constructed to enable them to be manufactured economically as well as to enable them to be constructed as monolithic cabinets or to be interlocked for purposes of forming them into racks and stacks. It is important, especially in high frequency applications, that the supporting members in which the edges of enclosure members are received be provided with electromagnetic interference shielding means that will provide electrical contact between the supporting members and the closure members to prevent outside signals from interfering with the electronic circuitry contained within the cabinet and to prevent signals occuring within the cabinet from interfering with electronic circuitry in adjacent cabinets or locations. It is also important to secure the enclosure members in position within the support members so that they will not rattle.

U.S. Pat. No. 4,115,655 discloses an EMI strip which includes spaced arcuate spring contacts and spaced contacts extending outwardly from the sides of the metal strip. The spaced contacts score the surfaces of a groove in a cabinet supporting member as the EMI strip is being inserted therein to break down the oxide coating and make electrical connection between the EMI strip and the supporting member. This EMI strip has proven to be difficult to insert and position within the groove because the contacts create too much friction in being moved along the groove.

SUMMARY OF THE INVENTION

The present invention relates to shielding devices and more particularly to electromagnetic interference shielding devices.

The present invention is realized by an L-shaped metal strip which includes spaced arcuate spring contacts extending outwardly from the widest section of the metal strip and inwardly-directed sharp tangs also in the widest section of the metal strip between the arcuate spring contacts. The L-shaped metal strip is inserted into a groove of an electronic cabinet metal supporting member, the arcuate spring contacts engage a surface of the groove to cause tangs 19 to score the other surface of the groove to break down the oxide coating and to maintain the metal strip therein and an edge of a metal closure member is slid along the spring contacts in the direction the contacts are disposed and this will cause a wiping action to take place between the spring contacts and the edge of the closure member thereby breaking down an oxide coating between the contacts and the closure member edge and to cause the inwardly-directed tangs to dig into the groove surface which also breaks down an oxide coating therebetween. In this way, an excellent electrical connection is established between the closure member and the supporting member which also establishes excellent electromagnetic shielding.

An object of the present invention is to provide an electromagnetic interference shielding device for disposition within groove means of a support member.

Another object of the present invention is the provision of an electromagnetic interference shielding device which has spaced spring contact means for securing the shielding device in position in groove means of a support member.

A further object of the present invention is to provide an electromagnetic interference shielding device which has spaced contact means for electrical contact with edge means of enclosure means.

An additional object of the present invention is the provision of an electromagnetic interference shielding device having first contact means for making electrical contact with surface means of groove means in a support member and second contact means for making electrical contact with edge means of closure means to be positioned in the groove means.

A still further object of the present invention is to provide an electromagnetic interference shielding device that will make electrical contact with a support member and an enclosure member and will maintain the enclosure member in position without rattling.

Still another object of the present invention is the provision of electromagnetic interference shielding means having contact means for scoring a surface of a support means to which it is to be secured to make electrical contact therewith and for securing said shielding means in position therewith.

BRIEF DESCRIPTION OF THE DRAWINGS

Other objects of the present invention will be apparent from the following detailed description of a preferred embodiment thereof and the attached drawings of which:

FIG. 1 is a part perspective view of an electromagnetic interference shielding device;

FIG. 2 is a side elevational view of part of the device of FIG. 1;

FIG. 3 is an exploded perspective view with parts broken away showing a support member, closure members and electromagnetic interference shielding device; and FIG. 4 is a front elevational view showing the parts of FIG. 3 in position.

DETAILED DESCRIPTION OF THE INVENTION

Referring to FIG. 1, an electromagnetic interference shielding device 10 is an L-shaped planar strip of metal which is preferably stainless steel that can be stamped and formed in accordance with conventional metal stamping techniques, does not have to be plated, has excellent spring characteristics, has excellent anti-corrosive characteristics and provides excellent electrical contact. Other metals can be used if desired so long as they have the requisite spring, anti-corrosive and electrical contact characteristics such as; e.g., beryllium copper, beryllium nickel, spring brass, etc.

EMI shielding device 10 is provided with spring contact members 12 which are in the form of cantilever springs having an arcuate configuration that have been stamped outwardly and formed out of metal strip 14. The stamping and forming of strip 14 into an L-shaped configuration is best accomplished by forming slots 15 in the metal strip between spring contact members 12 so that the smallest leg 16 of the L-shaped configuration can easily be bent. Spring contact members 12 are formed in the widest leg 17 of the L-shaped device and projection 18 are formed in leg 17 in alignment with slots 15 to strengthen the strip in these areas. Inwardly-directed triangular-shaped tangs 19 are formed in leg 17 between projections 18 and spring contact members 12.

Tangs 19 are directed in the same direction as the distal end of spring contact members 12.

Support member 20, which is disclosed in U.S. Pat. No. 4,123,129, is provided with P-shaped grooves 22 in which EMI shielding devices 10 are contained. EMI shielding devices 10 are inserted into respective grooves 22 of support member 20 in the direction that spring contact members 12 and tangs 19 face, which facilitates the movement of devices 10 along grooves 22. The width across device 10 is such that leg 16 extends along a radiused section of groove 22 and leg 17 extends along a flat surface of groove 22 and engages a lip 24. Spring contacts 12 engage a surface of groove 22 thereby forcing leg 17 against lip 24 to prevent device 10 from moving sideways out of groove 22. Tangs 19 score the surface of groove 22 they engage as device 10 is positioned into groove 22 to break through the oxide coating on this surface and thereby form an electrical connection therebetween.

Once devices 10 are positioned in grooves 22, closure members 26 are moved along grooves 22 in engagement with contact members 12 and in the direction that cantilever spring contact members 12 are directed. The movement of closure members 26 along grooves 22 in engagment with spring contact members 12 enables closure members 24 and contact members 12 to wipingly engage each other, thereby breaking down any oxide coatings thereon so that excellent electrical contact is made therebetween. The spring contact members 12 also keep closure members 26 from rattling.

The movement of closure membes 26 along grooves 22 and in engagement with spring contacts 12 causes tangs 19 to bite into the surface of groove 22 to make certain tangs 19 maintain their electrical connection integrity. Moving an instrument using the modular cabinet construction including the present EMI device will cause wiping action to take place between the closure members 26 and the spring contacts 12, thereby assuring electrical continuity, and tangs 19 will always be biting into the surfaces they engage to make certain oxide build up does not occur.

The spacing of the electrical contact members will be uniform and in accordance with the desired attenuation that will be involved. It is possible the support members and closure members will be made of plastic that has a metal coating thereon, and, if this is the case, the EMI shielding device will perform the same functions as if all metal members were being used.

The configuration of EMI shielding device 10 facilitates installation into the grooves of the support member at a minimum cost and the cost of manufacture of such shielding device is also economical. The shielding against emissions and susceptibility to interference by use of EMI shielding gasket 10 is most effective.

While a preferred embodiment of the present invention has been illustrated and described, it will be apparent that changes and modifications may be made to this invention without departing therefrom in its broadest aspects. The appended claims therefore cover all such changes and modifications as fall therewithin.

The invention is claimed in accordance with the following:

1. In combination with an electronic equipment cabinet including an elongate support member having means therein defining a longitudinally-extending groove, and a closure member having an edge portion thereof extending into said groove, improved electromagnetic interference shielding means disposed within said groove for maintaining electrical contact between said members, said shielding means comprising an elongate metal strip having an angular cross-sectional configuration provided by first and second leg portions thereof, a plurality of cantilever spring members disposed at spaced-apart locations along said first leg portion, said spring members extending in a generally longitudinal direction form one face of said portion, and a plurality of tangs projecting from the opposite face of said first leg portion, said strip being positioned within said groove with said spring members pressing said edge portion of the closure member against a first inner surface of said groove, and with said tangs engaging a second inner surface of the groove.

2. The combination of claim 1, wherein said metal strip has a substantially L-shape cross-sectional configuration.

3. The combination of claim 2, wherein said second leg portion of the metal strip is divided into a plurality of sections by slots provided at longitudinal locations intermediate those of said spring members.

4. The combination of claim 3, wherein said metal strip includes strengthing means formed in said first leg portion at locations opposite said slots.

5. An electromagnetic interference shielding device for use in combination with an electronic equipment enclosure that includes an elongate support member having means therein defining a logitudinally-extending groove, said shielding device comprising an elongate metal strip having an L-shape cross-sectional configuration provided by first and second leg portions thereof, a plurality of elongate cantilever spring members disposed at spaced-apart locations along said first leg portion, said spring members extending in a longitudinal direction outward from one face of said portion, and a plurality of tangs extending in the same direction from the opposite face of said first leg portion, said strip being configured for slidable insertion into said groove, whereupon said spring members and tangs engage different interior groove surfaces for retention of the strip therein.

6. The shielding device of claim 5, wherein said second leg portion of the metal strip is divided into a plurality of sections by slots provided at longitudinal locations intermediate those of said spring members.

7. The shielding device of claim 6, wherein said metal strip includes strengthening means formed in said first leg portion at locations opposite said slots.

* * * * *